United States Patent [19]
Pickup

[11] Patent Number: 5,498,977
[45] Date of Patent: Mar. 12, 1996

[54] OUTPUT DRIVER HAVING PROCESS, VOLTAGE AND TEMPERATURE COMPENSATION FOR DELAY AND RISETIME

[75] Inventor: Ray L. Pickup, Brush Prairie, Wash.

[73] Assignee: Hewlett-Packard Company, Palo Alto, Calif.

[21] Appl. No.: 397,812

[22] Filed: Mar. 3, 1995

[51] Int. Cl.⁶ .................................................. H03R 17/14
[52] U.S. Cl. ................... 326/31; 326/29; 326/32; 326/33
[58] Field of Search ............... 326/31–34, 21,29; 327/170, 179

[56] References Cited

U.S. PATENT DOCUMENTS

| | | | |
|---|---|---|---|
| 4,894,561 | 1/1990 | Nogami | 326/33 |
| 4,959,563 | 9/1990 | Schenck | 326/32 X |
| 4,975,598 | 12/1990 | Borkar | 326/33 X |
| 4,975,599 | 12/1990 | Petrovick, Jr. et al. | 326/32 |
| 5,017,807 | 5/1991 | Kriz et al. | 326/32 X |
| 5,111,081 | 5/1992 | Atallah | 326/32 |
| 5,118,971 | 6/1992 | Schenck | 326/32 |
| 5,267,096 | 11/1993 | Buchan et al. | 360/41 |
| 5,276,356 | 1/1994 | Shirotori | 307/270 |
| 5,376,846 | 12/1994 | Houston | 326/32 X |
| 5,379,230 | 1/1995 | Morikawa et al. | 364/483 |

*Primary Examiner*—David R. Hudspeth

[57] ABSTRACT

A digital LSI chip comprises the principal element of a printer controller. On the chip are output transistors for driving connection pads and external loads connected thereto. The chip performance is influenced by variations in the manufacturing Process, supply Voltage, and Temperature (PVT). All of these influence the time delay and risetime characteristics of the output transistors, as does varying the gain of predrivers supplying drive signals for the output transistors. To minimize the influence of PVT variables on these characteristics, a table of predrive gain needed to compensate the effect of PVT variables is generated for several points over the PVT range. Likewise, the frequency of a ring oscillator sensor is tabulated over the same points. These data are paired and stored in a memory. At startup and other times, a microprocessor determines the sensor frequency, accesses the table and sets appropriate predriver gains, thereby maintaining the output transistor characteristics nominally constant.

18 Claims, 5 Drawing Sheets

5,498,977

OUTPUT DRIVER HAVING PROCESS, VOLTAGE AND TEMPERATURE COMPENSATION FOR DELAY AND RISETIME

FIELD OF THE INVENTION

This invention relates to output amplifiers in integrated circuits, and in particular to compensating the signal characteristics of such amplifiers for the effects of process, voltage, and temperature variables.

BACKGROUND AND PRIOR ART

It is commonly known that certain electrical characteristics of semiconductor devices vary under the influence of both internal and external factors. For instance, the beta of a bipolar transistor varies according to variables in its manufacturing Process, to the applied supply Voltage, and to the environment Temperature. These factors are referred to by the acronym PVT.

In many applications of semiconductors, a large change in the electrical characteristics is undesirable and efforts are made to reduce the effects of PVT factors. A common technique—inverse feedback—senses a change of operation (e.g., signal delay), and then takes some action to reduce the change. Another approach is to sense the magnitude of PVT factors and then to modify some aspect of the circuit in a predetermined manner, thereby compensating the change of characteristics.

The present invention arose in the context of large-scale digital ICs (LSIs) used in printer controllers. A typical LSI device contains hundreds of thousands of transistors arranged in many different internal logic structures. It also contains several (relatively) large transistors as output amplifiers which are needed to drive the LSI bonding pads and whatever external loads are connected to them. As the operating speed of LSI devices has inexorably increased, a couple of PVT problems related to the output amplifiers have become serious enough to warrant a lot of effort towards their solution. These problems are a) change in the amplifier signal time delay and b) change in the amplifier signal risetime. In this disclosure, "risetime" refers both to the total transition time and to how abruptly the signal begins the transition.

Change in the amplifier signal time delay can cause logic failures in a printer control system due to excessive skew among various signals in the system. For instance, if the system clock is 50 MHz, a half-cycle (10 nanosecond) change in delay of a signal can cause a register to store wrong information. Delay variations of this order are not uncommon over the range of PVT factors.

Likewise, if the signal risetime becomes much faster than the designed value, electromagnetic interference can be radiated from signal lines connected to the LSI device. And, if ringing accompanies the faster risetime, there may be logic errors because of multiple threshold crossings.

If the amplifier gain is changed, this also varies signal time delay and risetime. However, this effect provides an opportunity for compensating PVT-caused changes in these characteristics. FIG. 1 illustrates one of several prior-art techniques for such compensation. Output amplifier 12 is located within IC 10, and is connected to an external load represented by the RC combination 22. Also within IC 10 is a resistor 16, whose value is affected by the same PVT factors that affect amplifier 12. Resistor 16 is, typically, either an isolated, doped channel in the substrate or a MOSFET operated below its pinch-off region. It is connected to an internal bias voltage V, and is paired with a stable external resistor 18 to create a voltage divider whose output is connected to a controller 20. The function of controller 20 is to convert the voltage divider output into an appropriate control signal on line 14 to apply to vary the gain of amplifier 12. Typically, amplifier 12 can be modelled as a transconductance, and its gain is varied by adjusting the coefficient of its dependent current source. Hence, controller 20 can be regarded as a translation circuit, whose function is to relate the PVT factors (represented by the voltage divider output) to the appropriate amplifier gain required to keep its delay and risetime constant. Now, the amplifier delay and risetime are affected not only by its gain and the PVT factors, but also by its load. If the admittance of load 22 were increased to, say, twice its nominal value, both delay and risetime would increase substantially. (This might happen if the amplifier drove a memory bus line, and optional memory packages were added.) If this happens, the compensation will be inaccurate unless controller 20 is modified to accomodate the changed conditions.

In LSI applications, such as printer controllers, it is common to have output amplifiers of different sizes driving loads of different values. With the design illustrated in FIG. 1, to get accurate compensation it would be necessary to have as many individual controllers as there are combinations of amplifiers and loads.

Clearly, what is needed is a device and technique for keeping amplifier delay and risetime substantially constant, and for accomodating manufacturing differences, environmental changes, and configuration changes with neither undue complexity nor unacceptable inaccuracy.

SUMMARY OF THE INVENTION

In the preferred embodiment of the invention, a LSI device uses power CMOS inverting amplifiers to drive the bonding pads. Such an inverter drives its own pad capacitance plus a nominal external load. In turn, the inverter input is driven by a "predriver", consisting of a number of smaller amplifiers with paralleled outputs.

As explained above, the inverter delay and risetime is affected by the PVT factors, by its own gain, and by its load. It is also affected by the gain of its predriver. In the preferred embodiment, predriver gain is varied to compensate the effect of PVT factors on the inverter.

Nominal values of inverter delay and risetime are chosen. Then, the predriver gain needed to compensate the effect of PVT factors and to maintain the nominal delay and risetime is determined at each of several points in the expected range of these factors.

To sense the magnitude of the PVT factors during operation, a ring oscillator is located in the LSI device. Its frequency is determined for the same points in the PVT range, thus creating a set of sense numbers over the range.

The frequency data is paired with the predriver gain data to form a table. This table is stored in RAM (or ROM) and is accessable by a microprocessor. At system startup and other suitable times, the microprocessor determines the oscillator frequency and the corresponding predriver gain needed, according to the prestored table. It then determines the composition of a subset of predriver amplifiers, whose gains are additive when parallel, to best approximate the needed gain. This subset is then enabled.

In another aspect of the invention, predriver gain is varied by modulating its output amplitude.

In yet another aspect of the invention, the relationship between oscillator frequency and predriver gain is stored as a mathematical formula (algorithm), which the processor evaluates as needed.

In still another aspect of the invention, the predriver gain is not varied. Rather, the output inverter amplifier is partitioned into a number of paralleled segments. An appropriate subset of these segments is enabled, thus modifying the inverter gain according to prestored data.

DETAILED DESCRIPTION OF THE INVENTION

Figure 1:
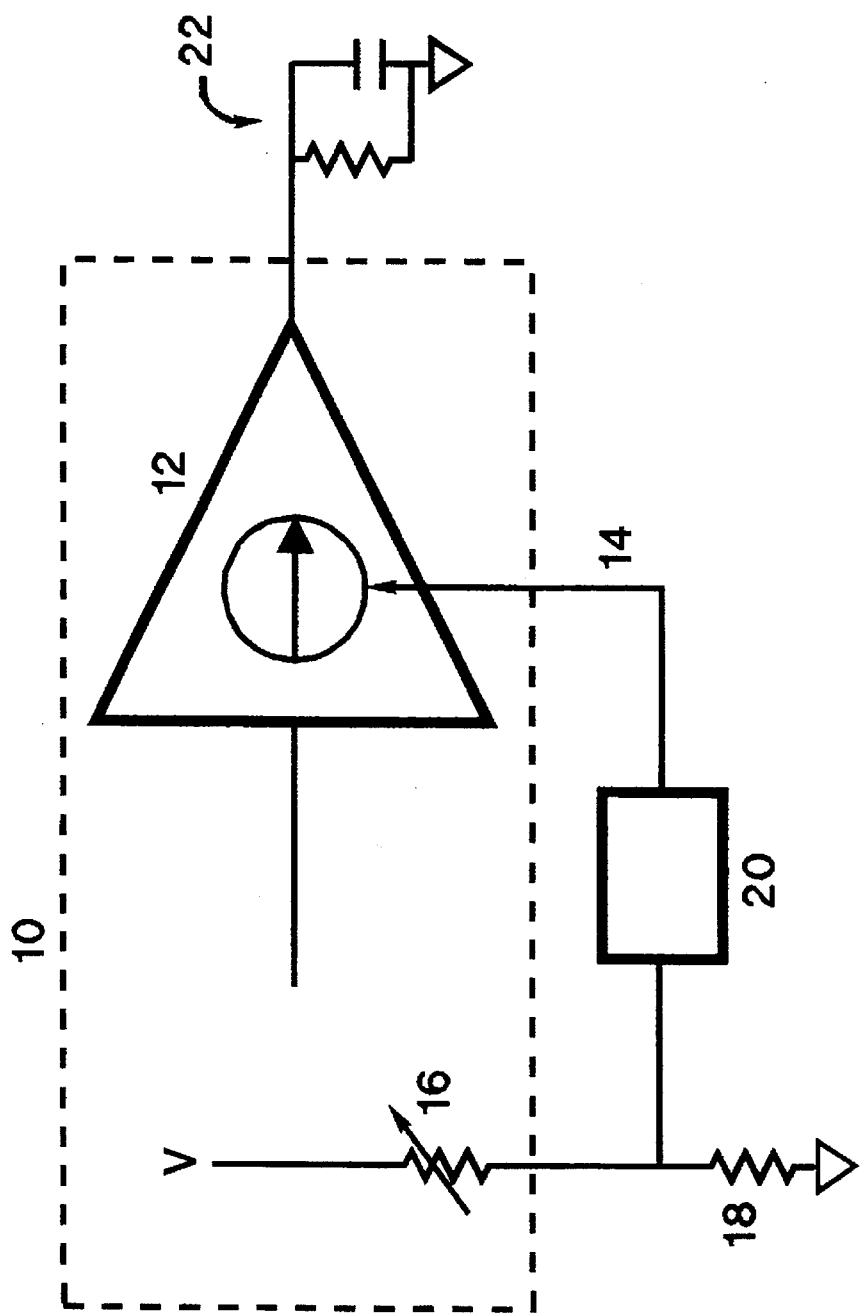
FIG. 1 is a schematic representation of a prior art means for compensating an amplifier for PVT variations.
Figure 2:
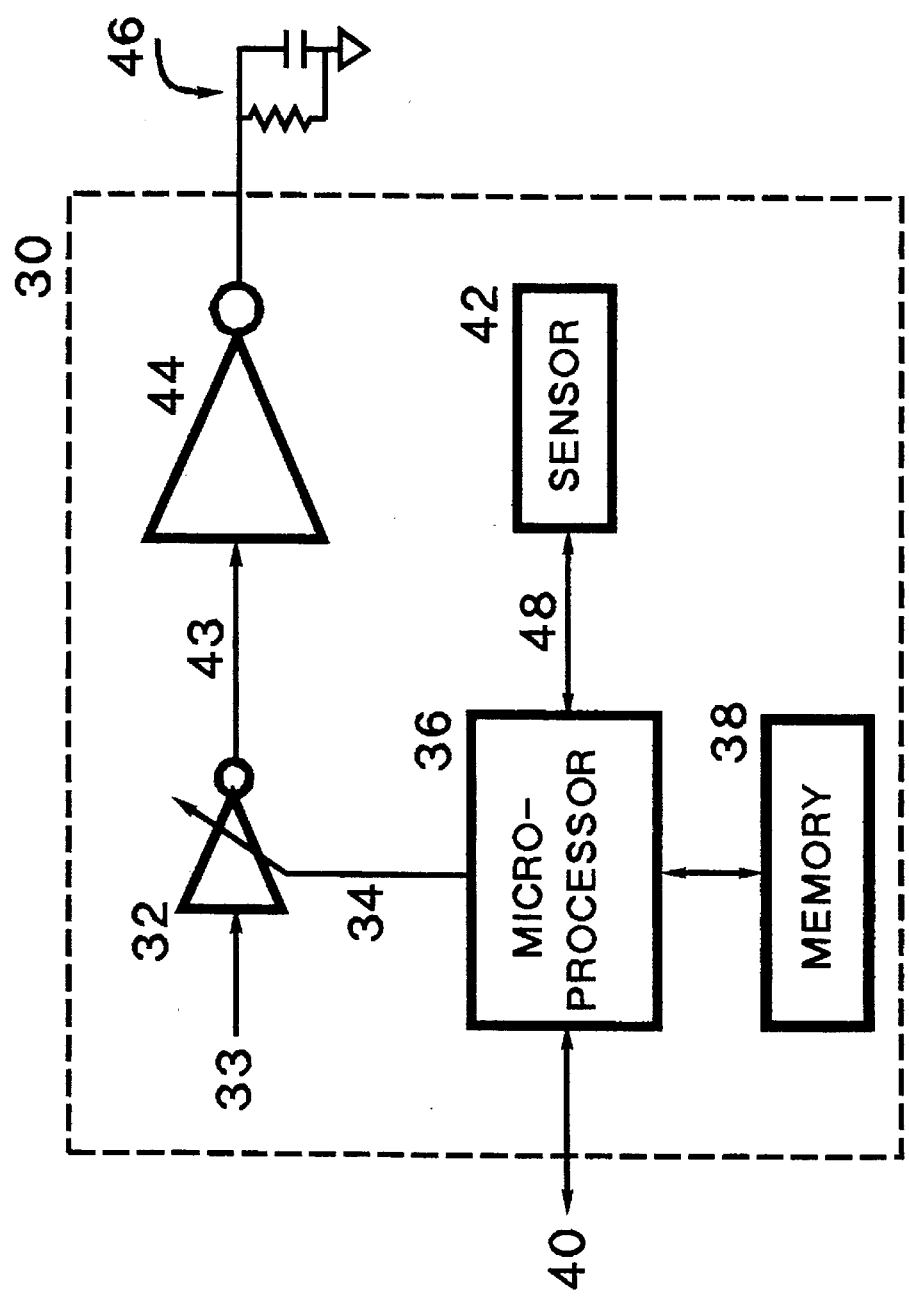
FIG. 2 is a block diagram of the preferred embodiment of the present invention.

Refer now to FIG. 2, which illustrates the preferred embodiment in block diagram notation. A LSI circuit ("chip") is indicated by the dotted box 30. This circuit is the principle component in a controller that governs the operation of an inkjet printer; however, it is similiar in architecture and function to many digital LSI circuits. There are many other circuit elements comprising the chip which are not shown, as they are not pertinent to a full explanation of the present invention. Included in circuit 30 are an output inverter amplifier 44, a variable gain "predriver" 32, a microprocessor 36, its RAM 38, and a sensor 42.

Inverter 44 is a relatively large CMOS device whose function is to drive an external load such as a serial data line. This load is connected to a metallic pad located close to inverter 44, and is represented by the RC combination 46. Because inverter 44 is a large device, it requires a dedicated predriver amplifier 32 to drive its input capacitance. Although predriver 32 is a digital circuit with only two nominal signal levels, its transfer gain is adjustable and is controlled through a control input, line 34. The reasons for this will be explained presently. Predriver 32 receives data on line 33 and supplies the amplified data on line 43 to drive the input of inverter 44.

Figure 3B:
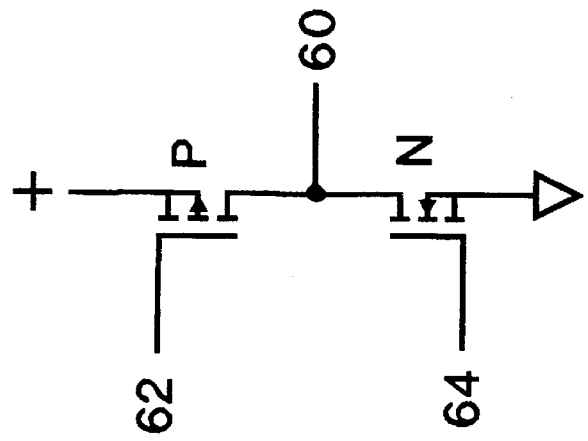
FIG. 3b is the configuration of a typical CMOS inverter.

Note the output inverter 44 detailed circuit in FIG. 3b. Because the chip is a CMOS circuit, inverter 44, predriver 32, and lines 33 and 43 are paired N- and P-channel devices as is usual in CMOS art. However, this aspect is not relevant to the present invention, and, to avoid clutter, single amplifier symbols are used in the drawings.

Microprocessor 36 is coupled with a memory (RAM and/or ROM) 38 in the customary manner. Microprocessor 36 also has a bidirectional line 40 which provides external-access for memory uploads and downloads and other data transfers as needed. Another bidirectional line 48 couples microprocessor 36 to a sensor 42. The structure and operation of sensor 42 will be explained in detail presently.

As indicated in the BACKGROUND section of this disclosure, the operation of inverter 44 is influenced by PVT factors. In particular, PVT factors modify the the time delay of the signal supplied to load 46, with respect to the inverter drive signal on line 43. Likewise, the factors affect the risetime (for both positive and negative transitions) of the load signal. In the preferred embodiment of the invention, these delay and risetime variations are minimized, as will now be explained.

Important principles incorporated in the invention are 1) determining the magnitude of the effect of the PVT factors, 2) modifying the delay and risetime of inverter 44 so as to substantially cancel the effect of the factors, and 3) readily adjusting the modification schedule when needed to accomodate IC design changes, load variations, and other requirements.

Figure 3A:
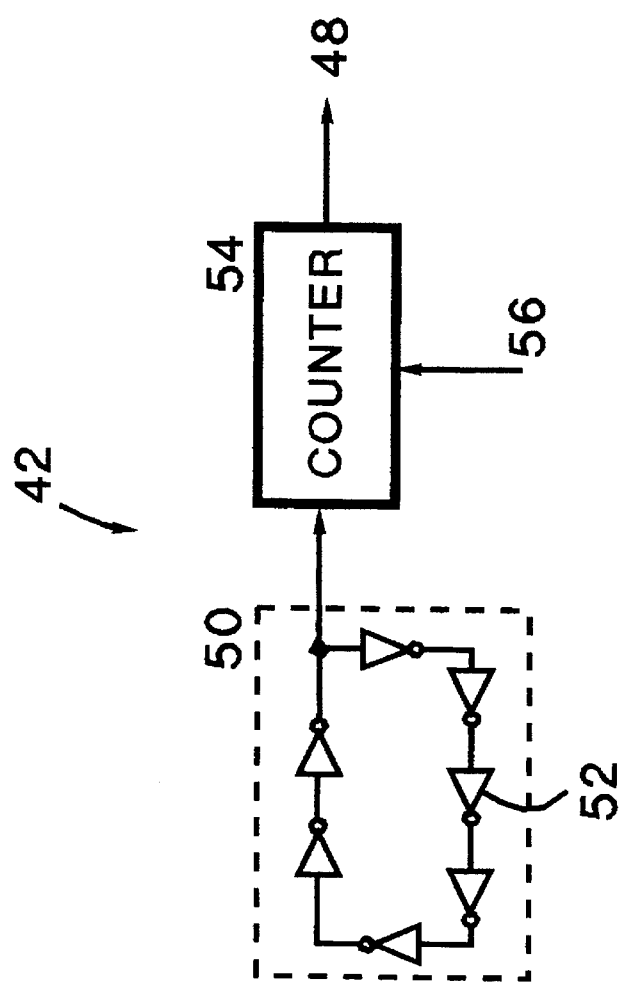
FIG. 3a shows details of the sensor of FIG. 2.

In order to determine the effect of the PVT factors, the operation of another device in the LSI chip is observed. This device is sensor 42, an oscillator whose frequency is directly influenced by the factors. FIG. 3a shows this device in more detail. Ring oscillator 50 is composed of an odd number of inverter circuits 52 connected in a ring configuration. Its period of oscillation is approximately twice the total time delay around the ring: that is, twice the sum of the individual inverter delays. Hence its frequency (the inverse of its period) varies as the inverter 52 delays and risetimes are modified by the PVT factors. The frequency is measured by counter 54, which is supplied with a time gating signal on line 56. The frequency data is sent to microprocessor 36 on line 48. Not shown in FIG. 3a is the ability of the microprocessor to turn oscillator 50 on only when frequency data is needed. These control signals travel to sensor 42 on line 48.

To understand the preferred embodiment, it is helpful to think of its activity as partitioned into two modes: a setup phase and an operating phase.

In the setup phase, the data needed for operation must be determined and stored. First, at each of a set of points representing the expected range of the PVT factors, the frequency of the ring oscillator 42 must be determined. This could be done experimentally, but, with the availability of circuit simulation algorithms such as SPICE, the oscillation period may be derived by simulation of the circuit conditions at each point.

Next, what must be determined is how to drive output inverter 44 so that its delay and risetime remain nominally constant over the set of points of the preceding paragraph. If the inverter were driven with an ideal signal with zero delay and risetime, it would respond with its best performance of finite delay and risetime. However, if the drive signal is not ideal, the inverter performance will also not be its best. A principle of the invention is to set the inverter performance at a predetermined, nominal value less than its best (but still satisfactory for the application) by supplying a non-ideal drive signal. Then the inverter performance may be varied as necessary by increasing or decreasing the drive signal delay and risetime. Since the drive signal delay and risetime are directly affected by the predriver gain, it is this gain which is used as a controlling parameter in the preferred embodiment. Over the same set of points in the PVT range, what is determined is the predriver gain which will maintain the inverter performance nominally constant at each point.

The setup phase concludes by pairing the frequency data and the gain data for each point and saving this relationship as a table in memory 38. In another embodiment of the invention, what is saved in memory 38 is a mathematical algorithm which allows the frequency/gain relation to be computed for any point. For instance, the coefficients of a polynomial passing through the set of points would facilitate interpolation of values between points. During the operating phase, at appropriate times microprocessor 36 enables sensor 42 and inputs its measured frequency. From the stored data in memory 38, it determines the corresponding value of predriver gain to compensate inverter 44.

Figure 4:
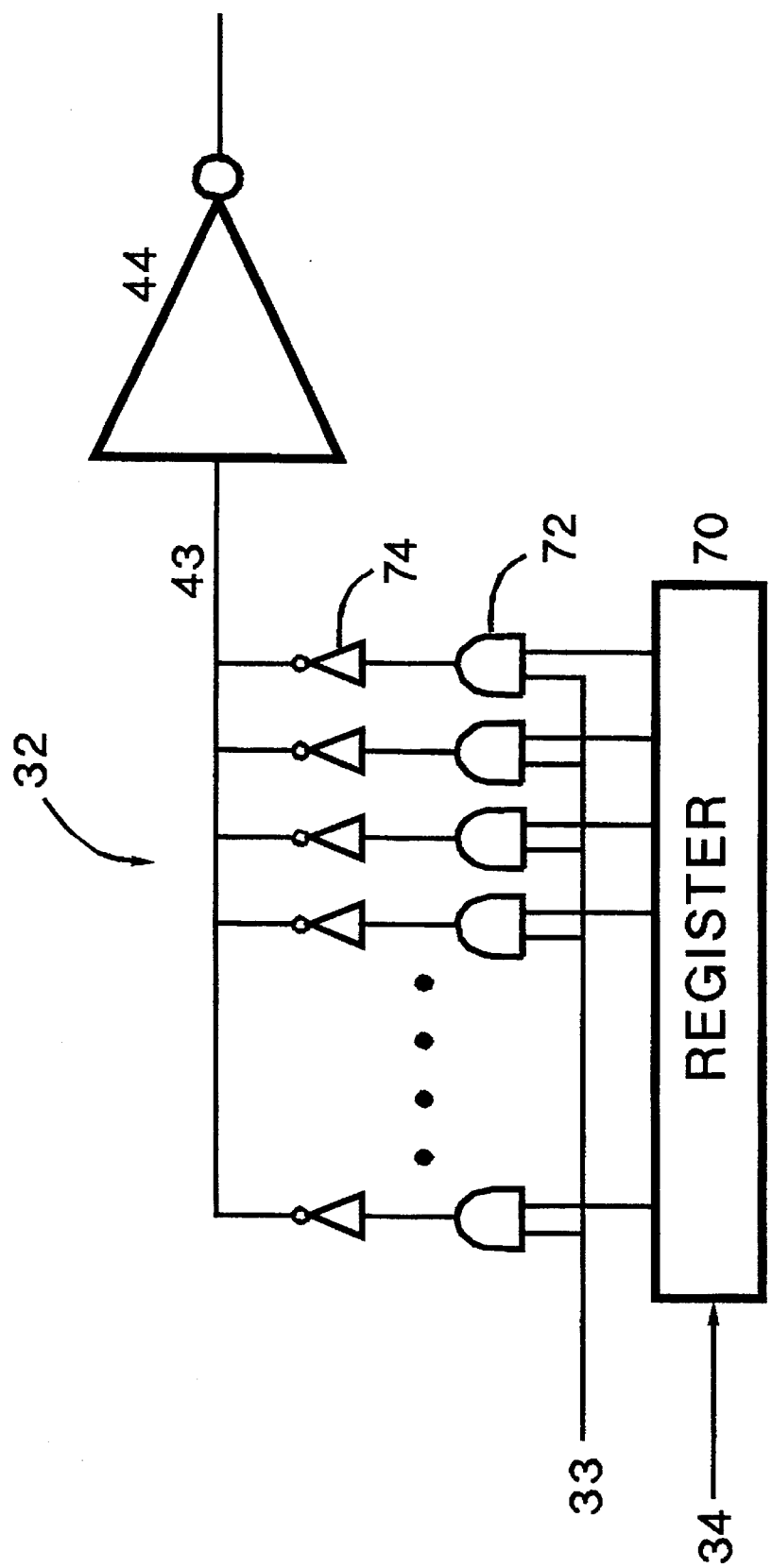
FIG. 4 shows details of the variable-gain predriver in FIG. 2.

How the predriver gain may be varied is shown by the details of predriver 32 in FIG. 4. A set of driver amplifiers 74 are connected with their outputs in parallel driving inverter 44 input line 43. The gain may be chosen by selecting a subset of amplifiers 74 to activate for use as predriver 32. (That the selection of a subset varies the net gain of the predriver may be understood from the fact that CMOS elements can be modelled as dependent current sources, which add when paralleled.) The microprocessor knows the values of gain for each of the set of predriver amplifiers 74 and determines a subset which best approximates the desired predriver gain. The subset is selected through AND gates 72, each connected to an amplifier 74. A writable register 70 enables or disables each gate. Register 70 is loaded with the appropriate subset data pattern by the microprocessor over control line 34. Data for output is available to each gate 72 on line 33.

It is a more efficient use of LSI "real estate" to have various gain values (ie., weights) assigned to the several amplifiers 74 in the predriver 32, rather than to use all identical amplifiers. If this is done, a given range of predriver gain may be achieved with a smaller number of amplifiers in the subset. It is particularly efficient if the weights have a binary relation, which results in the least number of amplifiers for the given range and resolution of gain. Weights may be determined by transistor layout, including the factors of size and channel width/length ratios.

Figure 5:
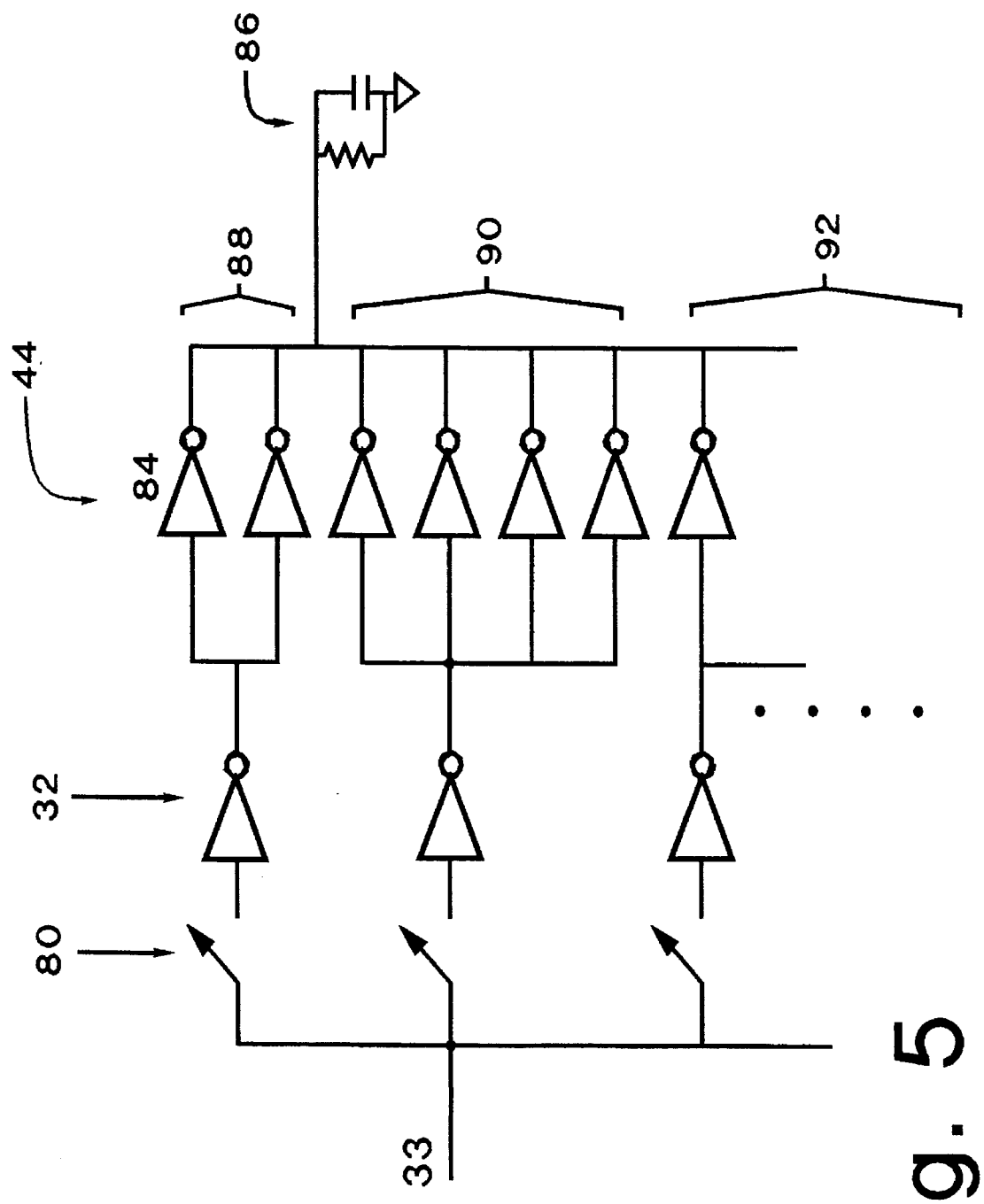
FIG. 5 illustrates an alternative embodiment, employing an variable-gain output amplifier.

Another embodiment of the invention is illustrated by FIG. 5. Output inverter 44 is shown as a composite of many individual inverters 84, with their outputs in parallel driving external load 86. This composite topology is, in fact, common in the design of large CMOS devices where both high speed and substantial current output are needed. In this embodiment, inverters 84 are partitioned into segments 88, 90, 92, etc. Inputs of the inverters in each segment are tied in parallel and each is driven by an appropriately sized predriver 32. A switch assembly 80 is arranged to connect data on line 33 to any selection of predriver-output inverter combinations. The segments 88, etc., do not necessarily have the same number of inverters 84. Just as in the case in the preferred embodiment, a binary progression of segment size is efficient for minimizing switching. (Usually, all inverters 84 are identical in size.)

The effective gain of the composite inverter 44 is proportional to the total number of individual inverters 84. This gain may be adjusted, according to a predetermined schedule, to maintain the nominal delay and risetime across the load, in the same fashion as was described in the case of the preferred embodiment.

I have described and illustrated the principles of my invention with reference to a preferred embodiment and other embodiments and aspects; however, it will be apparent that the invention can be modified in arrangement and detail without departing from such principles. For instance, more than one set of frequency/gain data can be available to be stored in the memory in order to accomodate changes, if made, in the output inverter load value. It will be recognized that the detailed embodiment is illustrative only, and should not be taken as limiting the scope of my invention. Rather, I claim as my invention all such variations as may fall within the scope and spirit of the following claims and equivalents thereto:

What is claimed is:

1. In an integrated circuit (IC) having an output transistor supplying a signal to an external load, a method for compensating variations in signal time delay and risetime of the output transistor, wherein the variations result from factors affecting the IC, including manufacturing process, supply voltage, and temperature, the method comprising the steps of:

generating, with a sensing circuit responsive to the factors affecting the IC, sense numbers corresponding to points in the range of those factors;

determining, for each point in the generating step, the gain, of a predriver driving the output transistor, required to maintain the output signal time delay and risetime substantially at predetermined values;

storing, in a memory circuit, a relationship incorporating the results of the determining step;

selecting, by referring to a sense number and the stored relationship, an appropriate value of gain for the predriver; and modifying the gain of the predriver in accordance with the value selected in the selecting step.

2. A method, as recited in claim 1, for compensating variations in signal time delay and risetime of the output transistor, wherein the sensing circuit comprises a ring oscillator and the generating step generates sense numbers proportional to the frequency of oscillation of the ring oscillator.

3. A method, as recited in claim 1, for compensating variations in signal time delay and risetime of the output transistor, wherein a microprocessor, accessing the stored relationship in the memory circuit, performs the selecting step.

4. A method, as recited in claim 1, for compensating variations in signal time delay and risetime of the output transistor, wherein the storing step stores the relationship in the form of a mathematical algorithm.

5. A method, as recited in claim 1, for compensating variations in signal time delay and risetime of the output transistor, wherein the storing step stores the relationship in tabular form.

6. A method, as recited in claim 1, for compensating variations in signal time delay and risetime of the output transistor, wherein the modifying step modifies the amplitude of the predriver.

7. A method, as recited in claim 1, for compensating variations in signal time delay and risetime of the output transistor, wherein a plurality of parallel drivers compose the predriver and the modifying step consists in selecting and activating a subset of these drivers.

8. A method, as recited in claim 7, for compensating variations in signal time delay and risetime of the output transistor, wherein the drivers have differently weighted values of gain.

9. A method, as recited in claim 8, for compensating variations in signal time delay and risetime of the output transistor, wherein the weighted values of gain have a binary relation.

10. In an integrated circuit (IC) whose signal risetime and delay characteristics are subject to variable factors including manufacturing process, supply voltage, and temperature, apparatus for maintaining nominally constant the signal risetime and delay of an output transistor contained in the IC, the apparatus comprising:

- a sensing device in the IC, responsive to the variable factors, and having a sense signal output;
- a variable-gain predriver circuit coupled to the output transistor, having an input for regulating the gain of the predriver;
- a memory circuit storing data relating the sense signal output to the corresponding predriver gain; and
- a microprocessor having an input coupled to the sense signal output, an output coupled to the predriver input, and a port coupled to the memory circuit.

11. Apparatus, as recited in claim 10, wherein the sensing device comprises a ring oscillator coupled to a counter supplying, as the sense signal output, a count proportional to the frequency of the ring oscillator.

12. Apparatus, as recited in claim 10, wherein the gain of the predriver circuit is varied by modulating its output amplitude.

13. Apparatus, as recited in claim 10, wherein the variable-gain predriver circuit comprises a plurality of parallel drivers, a subset of which is enabled.

14. Apparatus, as recited in claim 13, wherein individual drivers have different values of gain.

15. Apparatus, as recited in claim 14, wherein the different values of gain have a binary relation.

16. Apparatus, as recited in claim 10, wherein the relating data is stored as an algorithm.

17. Apparatus, as recited in claim 10, wherein the relating data is stored in tabular form.

18. In a integrated circuit (IC) having a composite output transistor composed of individual transistors supplying a signal to an external load, a method for compensating variations in signal time delay and risetime of the composite output transistor, wherein the variations result from factors affecting the IC, including manufacturing process, supply voltage, and temperature, the method comprising the steps of:

- partitioning the composite output transistor into a plurality of segments, each segment containing one or more individual transistors having paralleled inputs and outputs, wherein the outputs of the segments are connected in parallel and the input of each segment is driven by a predriver;
- generating, with a sensing circuit responsive to the factors affecting the IC, sense numbers corresponding to points in the range of those factors;
- determining, for each point of the generating step, the size and composition of a subset of segments to maintain, when enabled, the output signal time delay and risetime substantially at predetermined values;
- storing, in a memory circuit, a relationship incorporating the results of the determining step;
- selecting, by referring to a sense number and the stored relationship, an appropriate subset of segments and associated predrivers; and
- enabling the subset selected in the selecting step by applying a drive signal to the predriver of each member of the subset.

* * * * *